United States Patent [19]
Zhang et al.

[11] Patent Number: 5,548,238
[45] Date of Patent: Aug. 20, 1996

[54] LOW POWER HIGH SPEED CMOS CURRENT SWITCHING CIRCUIT

[75] Inventors: Zhong-Xuan Zhang; Jyhfong Lin; Yun-Ti Wang, all of Fremont, Calif.

[73] Assignee: Cirrus Logic Inc., Fremont, Calif.

[21] Appl. No.: 369,002

[22] Filed: Jan. 5, 1995

Related U.S. Application Data

[63] Continuation-in-part of Ser. No. 130,309, Oct. 1, 1993, Pat. No. 5,396,133.

[51] Int. Cl.$^6$ ................................................. H03K 17/04
[52] U.S. Cl. .......................... 327/374; 327/434; 327/437; 327/436
[58] Field of Search .................................. 327/434, 374, 327/108, 376, 377, 389, 391, 427, 399, 404, 437, 375, 436, 77, 78, 81, 89, 52, 563; 326/20, 95, 122

[56] References Cited

U.S. PATENT DOCUMENTS

| | | | |
|---|---|---|---|
| 4,134,033 | 1/1979 | Hoffmann et al. | 365/183 |
| 4,324,991 | 4/1982 | Tamaki | 327/404 |
| 4,374,357 | 2/1983 | Olesin et al. | 327/427 |
| 4,831,282 | 5/1989 | Colles | 326/29 |
| 5,214,316 | 5/1993 | Nagai | 327/399 |
| 5,382,840 | 1/1995 | Massoner | 327/399 |

*Primary Examiner*—Timothy P. Callahan
*Assistant Examiner*—My-Trang Nu Ton
*Attorney, Agent, or Firm*—Blakely, Sokoloff, Taylor & Zafman

[57] ABSTRACT

A high speed CMOS current switching circuit suitable for use in digital to analog converters for graphic interfaces having high pixel clock rates, and such interfaces as may be used in portable and other battery operated or low power consumption applications. In operation, the current switching circuit normally steers an idle current to ground. If the bit of the digital to analog converter input digital signal represented by the respective source is a 1, the input signal representing the bit is delayed slightly while the current steered to ground is increased from the idle value to the full desired output current, whereupon at the end of the delay, the device coupling the output current to ground is turned off, thereby forcing the output current through an output device. A low power current steering circuit which can perform dynamic current steering without affecting switching speed performance is also disclosed. During the mode 'off,' the path from current source to ground is completely cut off, so that at this mode there is no power consumption. Prior to turning to the 'on' mode, the current source $I_B$ is first turned on to establish a stable current and to bias all the related nodes. The current steering circuitry is then turned to mode 'on' to achieve a smooth transition. Similarly, the transition from mode 'on' to 'off' is achieved by steering the current to ground first and then cutting off the current source. Various embodiments are disclosed.

12 Claims, 9 Drawing Sheets

LOW POWER HIGH SPEED CMOS CURRENT SWITCHING CIRCUIT

This application is a continuation-in-part of U.S. patent application Ser. No. 08/130,309, filed Oct. 1, 1993, U.S. Pat. No. 5,396,133, entitled "High Speed CMOS Current Switching Circuits."

BACKGROUND OF THE INVENTION

1. Field of the Invention

The present invention relates to the field of high speed CMOS current switching circuits, such as current sources and the like.

2. Prior Art

It is well known to use current steering circuits for supplying and selectively directing currents to one or more outputs. One use of such steering circuits is in digital to analog converters in graphic interfaces wherein a plurality of such current steering circuits are used to selectively supply current components to a resistor to convert multiple bit digital signals to corresponding analog signals for direct input to an RGB monitor. In such applications, one or both of two requirements may be particularly important. In particular, in high resolution displays, the pixel rate will be particularly high. In addition, it is desirable to have as much of the pixel time as possible to represent the true analog value of a digital signal, and as little of the pixel time as possible devoted to the rise and fall times of a respective analog signal. Accordingly, speed of operation of the digital to analog converters and thus of the current steering circuits for each bit of the digital signal is of particular importance in such applications.

Also, in portable computers, power consumption is an important consideration. Consequently, while a current steering circuit must provide the required current to the load when the corresponding bit of the multi-bit digital signal being converted is a 1, it is highly desirable for the current steering circuit to draw minimal current (power) when a respective input bit thereto is a 0. Accordingly, it is highly desirable to maximize the operating speed and minimize the current requirements of such current steering circuits in applications such as digital to analog converters for graphic interfaces so as to make the same devices useful in high resolution graphic applications, low power consumption applications and/or both such applications.

In U.S. Pat. No. 4,831,282, a CMOS circuit is disclosed comprising three P-channel MOS devices. As shown in FIG. 1 of that patent, the source of the first device is connected to +5 volts and its gate is connected to a circuit so as to establish a gate-source voltage in the first device to provide a fixed, predetermined current through the device. The drain of the first device is connected to a node common with the sources of the second and third devices, with the drain of the second device providing the output current and the drain of the third device being connected to ground. The gate of the second device is held at a reference voltage so that when the gate of the third device is high (higher than the reference voltage on the gate of a second device), the third device will be off and the node will assume a voltage to establish a gate-source voltage across the second device to turn the device on just enough to conduct the fixed current through the first device to the circuit output. When the gate of the third device is low, the third device is turned on, pulling the node lower in voltage to establish the gate-source voltage in the third device to conduct the current through the first device to ground, thereby lowering the gate-source voltage of the second device to turn off the current flow to the output.

In essence, the foregoing circuit establishes a known current source through the first device, and either steers that current to ground or to the output. As such, the circuit is relatively simple and is stated in the '282 patent to "operate satisfactorily at frequencies in excess of 85 megahertz (85 MHz)." It has the disadvantage, however, of consuming a fixed amount of power per bit regardless of the input, as the same current is provided, independent of whether the bit is a 1 and the current is directed or steered to the output, or the bit is a 0 and the current is steered to ground.

In U.S. Pat. No. 5,179,292, CMOS circuits are disclosed which utilize four P-channel devices. In particular, in place of the single first device of the '282 patent, two devices in parallel are provided, one to establish a relatively small constant idle current and the other to provide a multiple of the idle current (such as, by way of example, fifteen times the idle current) upon the occurrence of the input bit being a 1. Thus, the idle current, normally directed to ground by one of the lower devices, establishes the node voltage, and only when a 1 bit is provided to the circuit is the current to the node increased to provide the full predetermined output current as desired. Accordingly, the power consumption of this circuit can be substantially less than in the circuit of the '282 patent because of its not consuming substantial power for 0 bit value inputs.

There is an advantage in being able to provide current switching circuits for use in graphic controller digital to analog converters which are of even higher speed and of low power consumption for high resolution and for battery operated computers. In that regard, it is desirable to minimize power consumption in all computers to allow closer component packing, smaller power supplies and lower operating temperatures with passive cooling as computers continue to become smaller and processing capability increases.

It is also desirable to provide low power current steering circuits which can perform dynamic current steering without affecting switching speed performance.

SUMMARY OF THE INVENTION

A high speed CMOS current switching circuit suitable for use in digital to analog converters for graphic interfaces having high pixel clock rates (high display resolutions), and such interfaces as may be used in portable and other battery operated or low power consumption applications. In operation, the current switching circuit normally steers an idle current to ground. If the bit of the digital to analog converter input digital signal represented by the respective source is a 1, the input signal representing the bit is delayed slightly while the current steered to ground is increased from the idle value to the full desired output current, whereupon at the end of the delay, the device coupling the output current to ground is turned off, thereby forcing the output current through an output device. A MOS transistor connected as a capacitor between the delayed signal input and the node determining the gate-source voltage of the output device reduces the time required to steer the output current from ground to the output device at the beginning of the pixel display time, and from the output device back to ground at the end of the pixel time. A specific circuit implementation is disclosed.

A low power current steering circuit which can perform dynamic current steering without affecting switching speed performance is also disclosed. During the mode 'off,' the path from current source to ground is completely cut off, so that in this mode there is no power consumption. Prior to turning to the 'on' mode, the current source is first turned on to establish a stable current and to bias all the related nodes. The current steering circuitry is then turned to mode 'on' to achieve a smooth transition. Similarly, the transition from mode 'on' to 'off' is achieved by first steering the current to ground and then cutting off the current source. Various embodiments are disclosed.

DETAILED DESCRIPTION OF THE INVENTION

Figure 1:
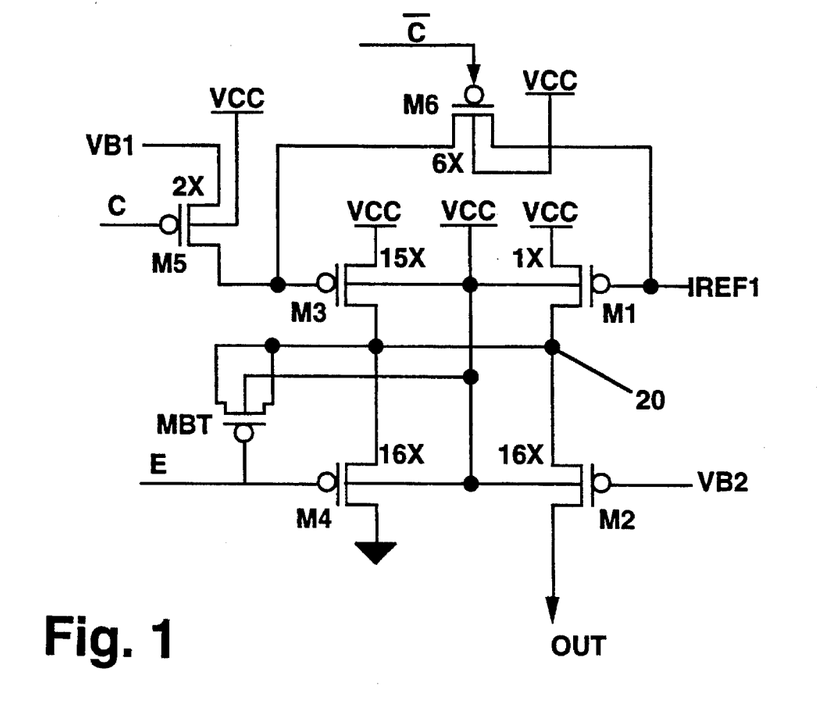
FIG. 1 presents the basic circuit for the current switching circuit of the present invention.

First referring to FIG. 1, the basic circuit for the current switching circuit of the present invention may be seen. In the preferred embodiment illustrated, the circuit is comprised of seven P-channel transistors. Transistor M1 has its source connected to Vcc and its gate connected to a reference voltage IREF1. Thus the gate-source voltage of transistor M1 is set to provide a relatively small and predetermined current through the transistor, subsequently referred to herein as an idle current. This current is provided by transistor M1 to node 20, which is a common connection for the drains of transistors M1 and M3 and the sources of transistors M2 and M4.

While transistor M1 provides an idle current to node 20 whenever power and reference voltages are applied thereto, the contribution of current through transistor M3 to node 20 will depend upon the gate to source voltage on transistor M3. If the gate voltage of transistor M3 is adequately elevated above IREF1, typically at or somewhat below Vcc, the transistor will be off, whereas if the gate voltage of transistor M3 is equal to the gate voltage of transistor M1, the current through transistor M3 will be mirrored from and thus equal to the current in transistor M1, ratioed (multiplied) by the relative size (width/length ratio) of transistor M3 and transistor M1. In that regard, in the preferred embodiment, the size of transistor M3 is fifteen times that of the size of transistor M1 so that when the gate of transistor M3 is at the same voltage as the gate of transistor M1, transistor M3 will conduct a current equal to 15 times the idle current in transistor M1.

As stated before, node 20 is connected to the sources of transistors M4 and M2. The drain of transistor M4 is connected to ground, with the drain of transistor M2 providing the current switching circuit output. The gate of transistor M2 is connected to a bias voltage, whereas the gate of transistor M4 is connected to an input signal E, a logic signal switching between the low state or voltage substantially at ground, and the high voltage approaching Vcc, dependent upon the specific input thereto. The bias voltage VB2 on the gate of transistor M2, on the other hand, is a voltage between these two extremes. Thus when the voltage of the input signal E is high, the gate-source voltage of transistor M4 will necessary be less than the gate-source voltage of transistor M2. Thus the current through transistor M1, and M3 if on, will raise the voltage of node 20 until the gate-source voltage of transistor M2 turns the same on to conduct the current in transistors M1 and M3 to the output OUT. If on the other hand, the signal E is low, the gate-source voltage of transistor M4 will necessarily be greater than the gate-source voltage of transistor M2, turning on transistor M4 and pulling the voltage of node 20 down sufficiently to turn off transistor M2.

Finally, with respect to the basic connections of the remaining transistors, transistor MBT is connected as a capacitor, having both diffused regions thereof (source and drain) connected to node 20 and its gate connected to the signal E. Transistor M5, on the other hand, is connected as a simple switch, being off or non conductive when the signal C is high, and conductive when the signal C is low to connect the gate of transistor M3 to VB1. Transistor M6 similarly operates as a switch, being off when the signal $\overline{C}$ is high, and on when the signal $\overline{C}$ is low to connect the gate of transistor M3 to the same reference voltage IREF1 as set on the gate of transistor M1.

Figure 2:
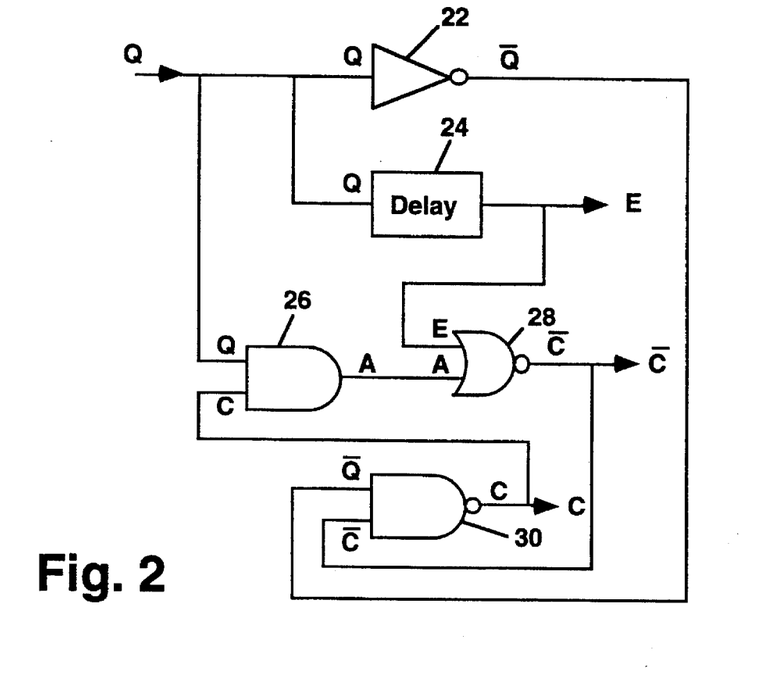
FIG. 2 shows the logic for generation of the C, $\overline{C}$ and E signals.
Figure 3:
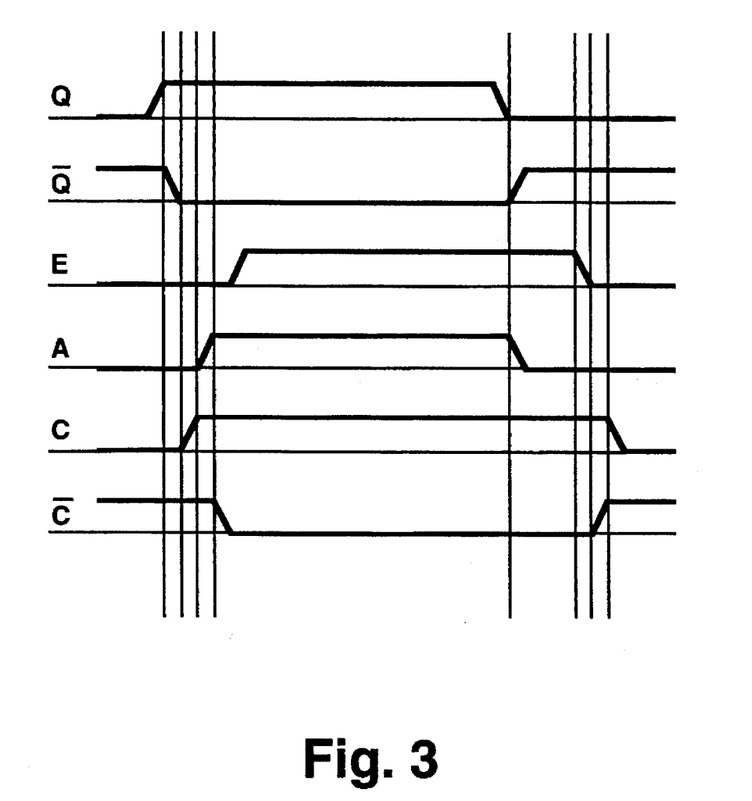
FIG. 3 illustrates the signal wave forms, exaggerated in some respects for clarity, of the various signals shown in FIG. 2.
Figure 4:
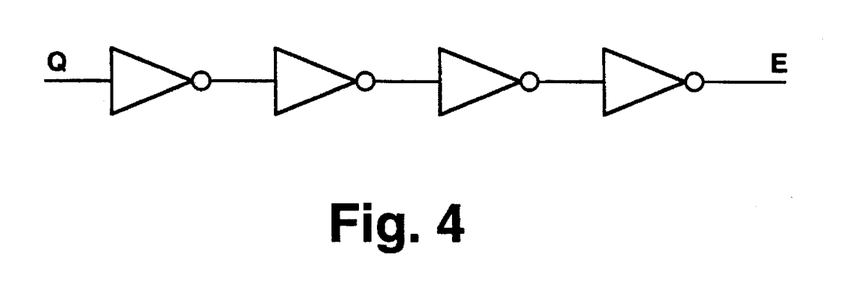
FIG. 4 shows a series of four inverters which impose the delay 24 of FIG. 2.

Before describing the detailed operation of the circuit of FIG. 1, it is believed best to first describe the generation and sequencing of the input signals C, $\overline{C}$ and E. For this purpose, reference is made to FIG. 2, which shows the logic for generation of these signals. Reference is also made to FIG. 3, which generally illustrates the signal wave forms, exaggerated in some respects for clarity, of the various signals shown in FIG. 2. FIG. 3 illustrates non-overlapping signals C and $\overline{C}$ surrounding signal E generated by the circuit shown in FIG. 2. Referring now specifically to FIG. 2, the input to the circuit is the signal Q, which in a digital to analog converter in a graphic interface, would be a bit representing an incremental step in intensity of one of the three colors in an RGB system. As shown in FIG. 2, the signal Q is inverted by inverter 22 to provide the inverted signal $\overline{Q}$. Thus the signal $\overline{Q}$ is the inverse of the signal Q, as may be seen in FIG. 3. In that regard, the signal $\overline{Q}$ as the inverse of the signal Q is shown delayed slightly in FIG. 3, not for the reason that any intentional delay is imposed, but rather simply for purposes of illustration of the point that $\overline{Q}$ is responsive to Q rather than Q being responsive to $\overline{Q}$. Also as shown in FIG. 2, the signal Q is in fact intentionally delayed by delay 24 to provide the signal E replicating the signal Q, but with a now intentional delay. In that regard, the delay 24 of FIG. 2 is simply imposed by a series of four inverters, as shown in FIG. 4. In the preferred embodiment, each inverter is a fast response inverter, so that the total delay of the signal E with respect to signal Q is on the order of 1 nanosecond. Assuming for the moment that the circuit has settled with Q low, $\overline{Q}$ is of course high and E is low. Since Q is low, the output A of the AND gate 26 is also low. Since E and A are both low, the output $\overline{C}$ of NOR gate 28 will be high. With $\overline{C}$ and $\overline{Q}$ both high, the output C of NAND gate 30 will be low.

When Q first goes high, $\overline{Q}$ will follow by going low. This drives one input to NAND gate 30 low, driving the output C high, the transition in the signal C shown in FIG. 3 being delayed with respect to $\overline{Q}$ solely for purposes of separating the cause and effect of the signal transitions. With C and Q both high, the output A of AND gate 26 also goes high, and since one input of NOR gate 28 is now high, the output $\overline{C}$ thereof goes low in response thereto. In general, these transitions all occur within the delay of the delay circuit 24, so that after the foregoing described transitions, the delayed signal E finally goes high.

Q will go low when the respective bit goes low, either prior to the end of a pixel time, or if the corresponding bit remains unchanged for a number of pixel times, then prior to the end of that last pixel time. In any event, when Q goes low, both $\overline{Q}$ and A go low. Then at the end of the delay of delay circuit 24, E will go low, pulling $\overline{C}$ high which in turn pulls C low, placing the circuit in its original state awaiting the next time Q goes high again.

In the embodiment shown in FIG. 1, transistor M3 will conduct 15 times the current of transistor M1, and transistors M2 and M4 will conduct 16 times the current of transistor M1, assuming the same gate to source voltages thereon. Thus in the idle state when the input is low, the current through transistor M1 and M4 to ground is only one sixteenth that of the output current when the input is high. Also while the output is delayed somewhat compared with the input, this is a delay of only a fraction of a pixel time in a high resolution display.

In the foregoing description, the invention was disclosed in conjunction with a four transistor current switching circuit and the control thereof. The invention may also be used with a three transistor cell, wherein the fourth transistor acts as a capacitive boost to the cell to speed the operation thereof.

In any embodiment, the magnitude of the capacitance provided by transistor MBT is important to the speed-up of the circuit. If the capacitance is too low, less than all the speed-up will be realized. However if the capacitance is too large, the node 20 will rise almost in step with the drive signal E, turning transistor M2 on quickly, but then dumping much of the charge on the transistor MBT into the node and through transistor M2, converting what would have been a fast response to an overshoot in the output current. This characteristic, properly proportioned, can be beneficial in providing an initial charge surge in the output current to drive the capacitive loading on the output. In general, a good value for the capacitance of the transistor MBT is the value which, upon the signal E going high, will capacitively drive node 20 to approximately its stable voltage representing transistor's M2 on voltage and transistor's M4 off voltage, or depending on the output capacitance to be driven, slightly above the foregoing voltage. Also, while the source of transistor M5 may be connected to Vcc, making VB1 =Vcc, it has been found that it is preferable to set VB1 to a reference voltage below Vcc by an amount slightly less than the threshold of transistor M3, still adequate to hold transistor M3 off when transistor M5 is on. In particular, making VB1 equal to Vcc charges the gate of transistor M3 and associated connections more than necessary to hold transistor M3 off. Then when transistor M5 turns off and transistor M6 turns on, this charge couples to IREF1, upwardly disturbing the same momentarily which in turn momentarily diminishes the current diverted from transistor M4 to the output. In a 5 volt embodiment of the present invention, setting VB1 to 4.2 volts by imposing a diode voltage drop from Vcc adequately holds transistor M3 off when transistor M5 is on, yet minimizes the foregoing undesired capacitive coupling.

Figure 5:
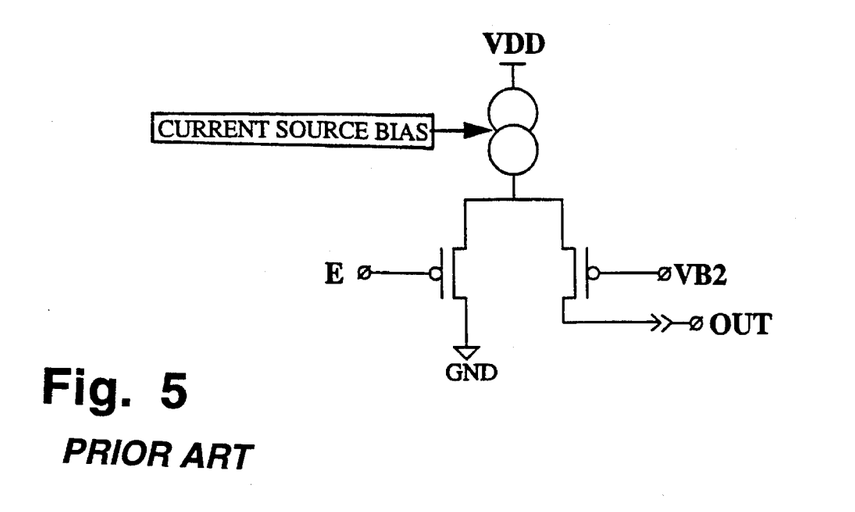
FIG. 5 depicts a conventional current steering circuit.

Another aspect of the present invention is a dynamic current steering circuit for implementing low power current steering circuitry without affecting its switching speed performance. FIG. 5 illustrates a conventional current steering circuit. Such a conventional current steering circuit consumes constant current whenever the current steering cell is steering the current to the output summing node (mode 'on') or steering the current to ground (mode 'off'). As shown in FIG. 5, when the potential of node E is higher than node VB2, the current will steer to the output node OUT and when the potential of E is lower than node VB2, the current will steer to the GND node. The advantage of current steering is its sharp rise and fall time and, since the current source is constantly on, the distortion to the current source is also minimized. The speed of performance in such current steering circuits is generally significant. It is therefore also desirable to provide low power steering circuits which can perform current steering without affecting switching speed performance.

Figure 6:
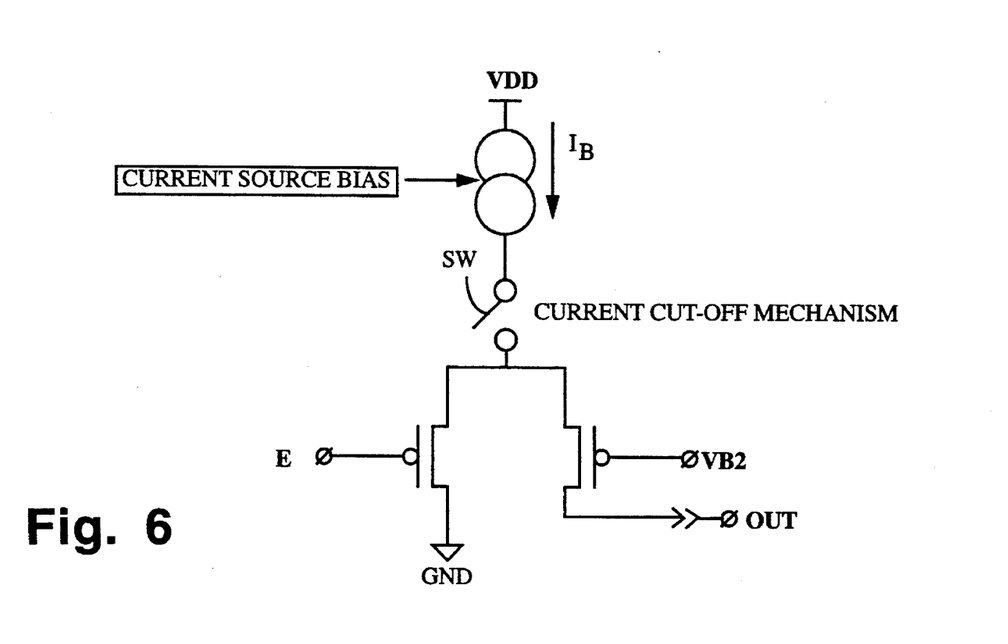
FIG. 6 depicts the basic circuit for the dynamic current steering circuit in accordance with another aspect of the present invention.

FIG. 6 illustrates a basic circuit for the dynamic current steering circuit in accordance with another aspect of the present invention. During the mode 'off,' the path from current source to ground is completely cut off, by opening switch SW, so that in this mode there is no power consumption. Approximately a few nano-seconds before the current steering circuitry turns to mode 'on,' the current source $I_B$ is first turned on by closing switch SW, to establish a stable current to ground and to bias all the related nodes. The current steering circuitry is then turned to mode 'on' to achieve a fast and smooth transition of current flow from ground to the output. Similarly, the transition from mode 'on' to 'off' is achieved by first steering the current from the output to ground, and then cutting off the current source by grounding switch SW.

Figure 7A:
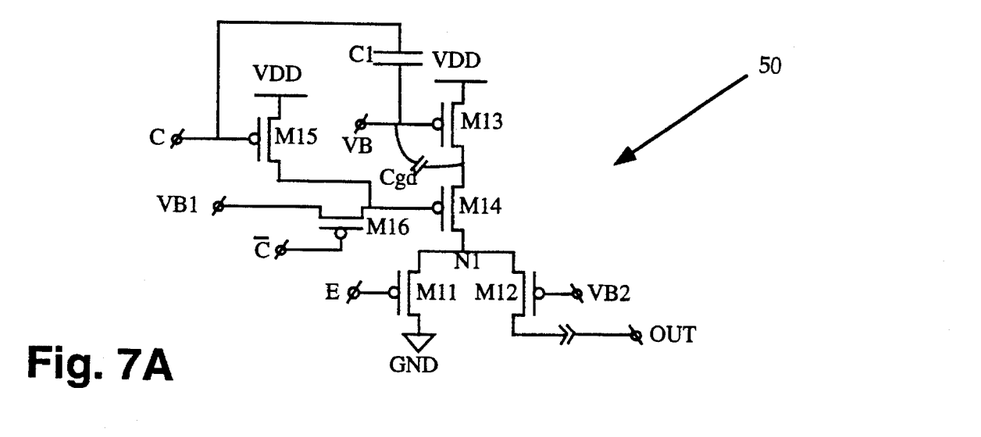
FIG. 7A depicts a schematic diagram of one embodiment of the dynamic current steering circuit shown in FIG. 6.

FIG. 7A depicts one embodiment of the dynamic current steering circuit of FIG. 6. In this embodiment, the circuit 50 comprises six P-channel transistors. Transistor M13 has its source connected to voltage source VDD and its gate connected to a bias voltage VB. The source of M14 is connected to the drain of M13, so that with the biasing to be described, M13 and M14 together form a switchable cascode current source. M11 and M12 are differential-pair-type current-steering transistors. The sources of M11 and M12 are connected to the drain of M14, while the gate of M11 is connected to the signal E and the drain of M11 is connected to ground (GND). The gate of M12 is connected to bias voltage VB2 and the drain of M12 is connected to the output OUT. The source of M15 is connected to VDD, while its gate is connected to signal C and its drain is connected to the gate of M14. The source of M16 is connected to VB1, while its gate is connected to $\overline{C}$ and its drain is connected to the gate of M14. VB, VB1 and VB2 provide gate biasing for the respective devices from biasing circuitry, not shown, but the design of which is well known. VB biases transistor M13 as a current source. With respect to bias voltage VB1, when transistor M16 is on and transistor M15 is off, VB1 biases transistor M14 as part of the cascode current source comprising transistors M13 and M14. When transistor M16 is turned off and transistor M15 is turned on, the gate of transistor M14 is pulled high, turning transistor M14 off to turn off the cascode current source.

Bias voltage VB2 is a voltage between the logic high and logic low of the digital signal E so that the signal E positively turns M11 on and M12 off when in the low state, and M11 off and M12 on when in the high state, as subsequently described in greater detail. E, $\overline{C}$ and C are digital control signals. A capacitor, C1 is coupled between the gates of M15 and M13. A second, parasitic capacitor, Cgd, comprising the gate-drain capacitance of transistor M13 is also shown in FIG. 7A.

Figure 7B:
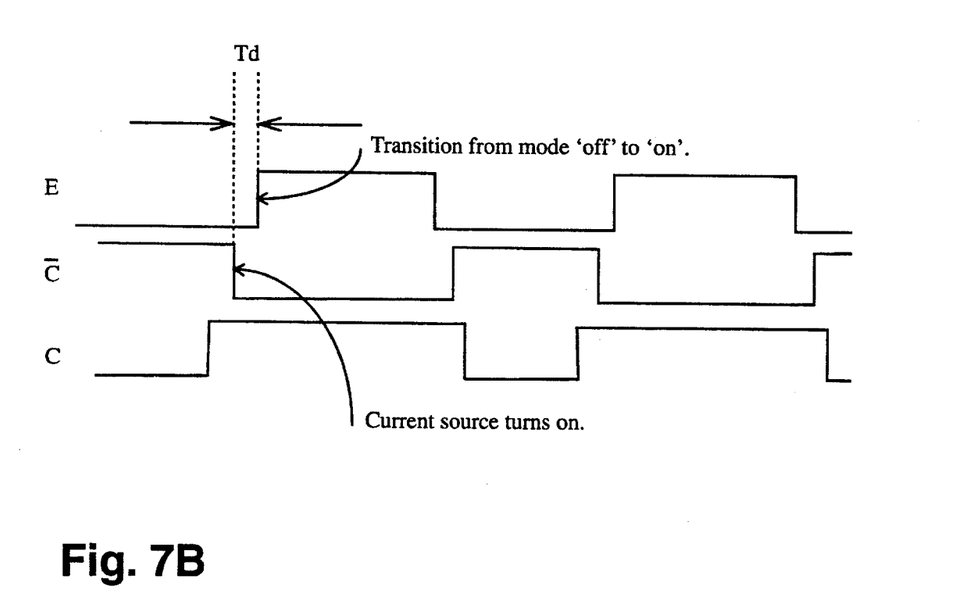
FIG. 7B depicts a timing diagram illustrating the control signal and transition cycles of the dynamic current steering circuit of FIG. 7A.

FIG. 7B depicts the timing diagram for the control and transition cycles of the dynamic current steering circuit 50 of FIG. 7A. In the quiescent state, circuit control signals C and E are low and $\overline{C}$ is high. In this state, the high state of signal $\overline{C}$ turns off transistor M16 and the low state of signal C turns on transistor M15, pulling the gate of transistor M14 high to turn off transistor M14 and thus block any current that otherwise would flow through transistor M13. The low state of signal E at this time holds transistor M11 on, though there is no current flow there-through because of transistor M14 being off.

When the circuit is first activated in response to a digital input signal such as Q going high, the signal C goes high, turning off transistor M15, and very shortly thereafter the signal $\overline{C}$ goes low. This turns on transistor M16 to bias the gate of transistor M14 to the cascode current source bias VB1, so the transistors M13 and M14 now form the active cascode current source. Since the signal E is still low at this time, transistor M11 remains on, directing the current from the cascode current source of transistors M13 and M14 to ground. With transistor M11 on, node N1 is pulled low, turning off transistor M12 so that all conduction is through transistor M11 to ground under these conditions.

After a time delay Td adequate to allow stabilization of the current through the cascode current source M13 and M14 and through transistor M11 to ground, the signal E goes high. This turns off transistor M11, with the current through the cascode current source now pulling node N1 higher so as to bias transistor M12 on, thereby now steering all of the cascode current source current to the output OUT.

Upon a change in the logical input Q cycle, the control signals return to their quiescent state in reverse order. More specifically, signal E first goes low, turning on transistor M11 to pull node N1 low, turning off transistor M12 so as to now steer the current through transistor M11 to ground. Then the signal $\overline{C}$ goes high to turn off transistor M16, and substantially immediately thereafter the signal C goes low to turn on transistor M15, pulling the gate of transistor M14 high by connection thereof to the supply voltage VDD through transistor M15.

In general, the signal C and $\overline{C}$ are phased so that both transistors M15 and M16 cannot be on at the same time, though otherwise these signals preferably follow each other very closely in the sequence shown in FIG. 7B to minimize delays between circuit activation and actual circuit output current. The signal E, on the other hand, is delayed on the rising edge with respect to signal $\overline{C}$, to allow the current directed to ground to stabilize before steering the same to the output.

In the dynamic current steering circuit 50 of FIG. 7A, capacitor C1 is used to compensate distortion on node VB introduced by the parasitic capacitance Cgd of M13 during current source switching. Because the signal C is toggling in an opposite polarity from the drain voltage of M13, the charge distortion introduced by Cgd of M13 is compensated by injecting charge to VB through C1 during each mode transition. C1 may be a metal oxide semiconductor (MOS) capacitor or any other type of capacitor as known in the art. In addition, signals C and $\overline{C}$ are generated in a specific sequence to prevent VDD from shorting to the bias circuitry connected at VB1. Specifically, signal C transitions to a high logic level prior to $\overline{C}$ transitioning to a low level. Conversely, C transitions to a low level shortly following the transistion of $\overline{C}$ to a high level. The control signals may be generated, by way of example, using the circuits of FIGS. 2 and 4.

Figure 8A:
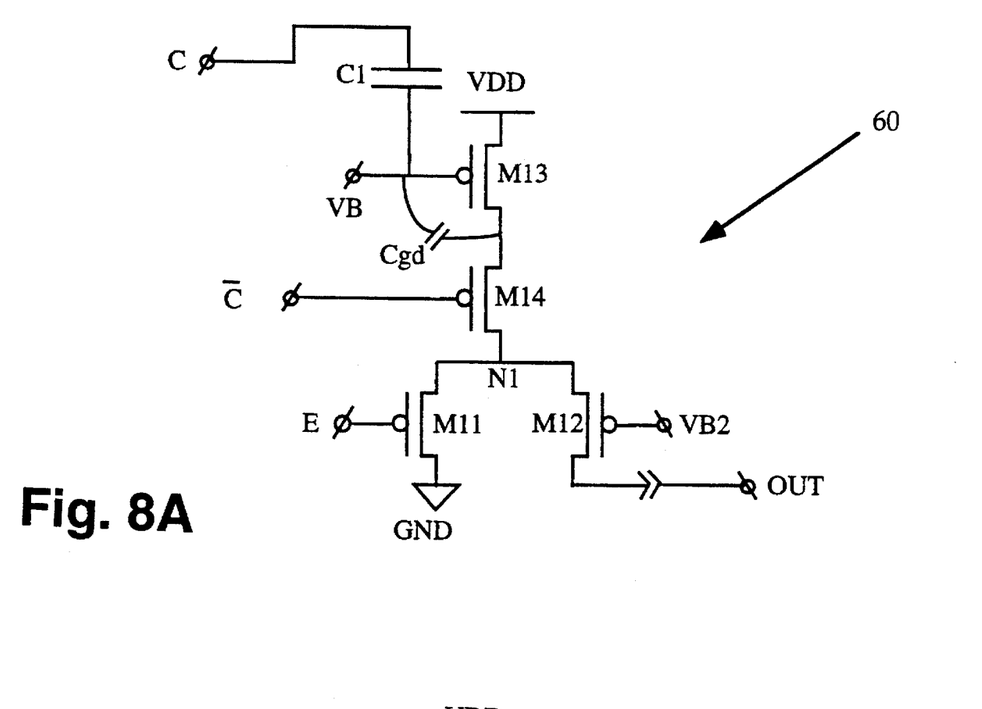
FIG. 8A depicts a schematic diagram of a second embodiment of the dynamic current steering circuit shown in FIG. 6.

FIG. 8A depicts a second embodiment of the dynamic current steering circuit of FIG. 6. The circuit 60 shown in FIG. 8A is essentially a simplified version of the circuit 50 shown in FIG. 7A. The circuit 60 comprises four P-channel transistors and capacitor C1. Transistor M13 has its source connected to voltage source VDD and its gate connected to VB. The source of M14 is connected to the drain of M13 and the gate of M14 is connected to $\overline{C}$. M11 and M12 are differential-pair-type current-steering transistors. The source of M11 is connected to the drain of M14 while its gate is connected to E and its drain is connected to ground (GND). The source of M12 is connected to the drain of M14, while its gate is connected to VB2 and its drain is connected to the output OUT. A capacitor, C1 is coupled to control signal C on one end and to the gate of M13 at another end. The parasitic gate-drain capacitance, Cgd is coupled between the gate and drain of M13.

Thus, instead of using a cascode bias as depicted in the circuit of FIG. 7A, which requires M14 to be biased in the saturation region, the circuit 60 of FIG. 8A requires M14 to operate in the triode region. As a result, M14 acts as a pure switch and the digital signal $\overline{C}$ can be applied to the gate of M14 directly. A possible side-effect in using the circuit 60 is that ground bounce may be injected to the output through $\overline{C}$, resulting in a noisy output. This side-effect may be improved by providing a separate stable ground GND.

Figure 10A:
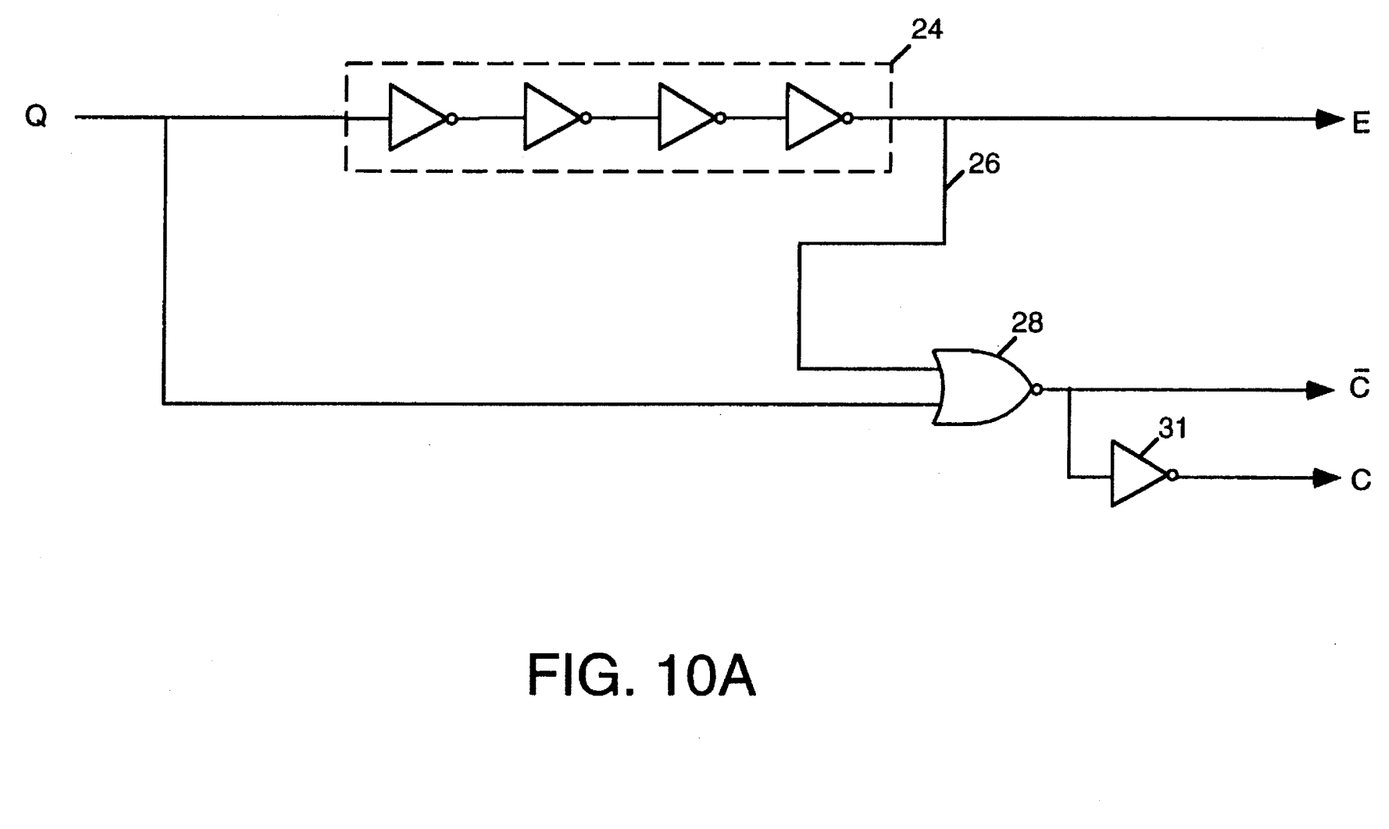
FIG. 10A depicts another embodiment of the logic circuit for generating the control signals C, $\overline{C}$ and E.

In a preferred embodiment, the control signals for circuit 60 are generated using the circuit shown in FIG. 10A. Alternatively, the control signals may be generated using the circuit of FIG. 10B. Either of these control circuits will provide the control signals for generating the timing diagram of FIG. 8B, as discussed in detail below.

The control circuit of FIG. 10A permits the signal E to be delayed on the rising edge with respect to the signal $\overline{C}$, to allow the current directed to ground to stabilize before steering the same to the output. This is accomplished through the use of a series of four inverters 24. In a preferred embodiment, each inverter is a fast response inverter, so that the total delay of the signal E with respect to signal Q is on the order of 1 nanosecond. The output of the series of inverters 24 is provided as the signal E, and also as one input 26 to the NOR gate 28. The signal Q is provided as a second input of the NOR gate 28. The output of the NOR gate 28 provides the signal $\overline{C}$. This output is simultaneously inverted via inverter 31 to provide the signal C. In an alternative embodiment, the circuit of FIG. 10B may provide the control signals for generating the timing diagram of FIG.

Figure 10B:
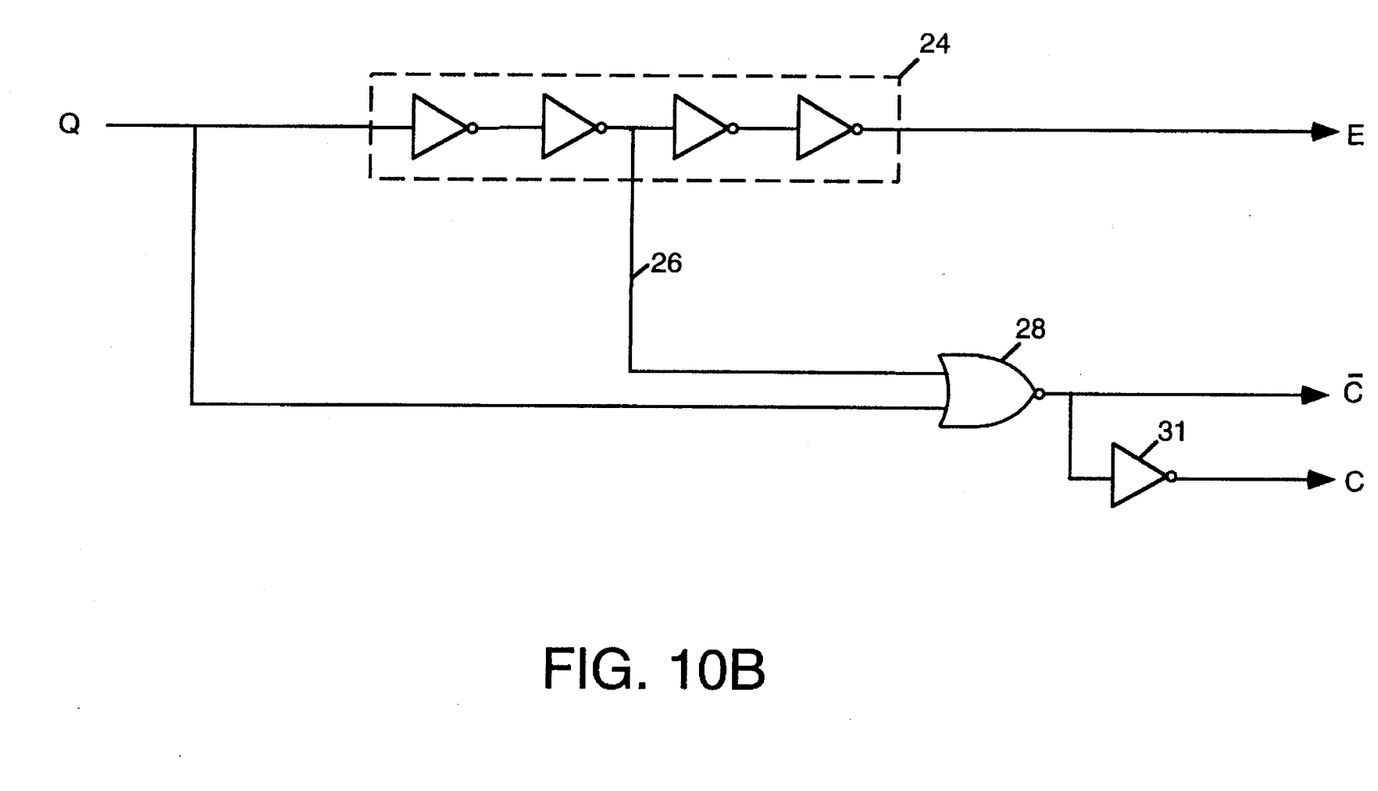
FIG. 10B depicts a further embodiment of the logic circuit for generating the control signals C, $\overline{C}$ and E.

8B. The circuit of FIG. 10B is identical to that of FIG. 10A, with the exception that the output of the first two inverters in the inverter series 28 provides the input 26 of NOR gate 28.

When the circuit 60 is first activated in response to a digital input signal such as Q going high, the signal $\overline{C}$ goes low. The inverter 31 inverts the signal $\overline{C}$, during the signal C high. This biases the gate of transistor M13 to the cascode current source bias VB, so the transistors M13 and M14 now form the active cascode current source. Since the signal E is still low at this time, transistor M11 remains on, directing the current from the cascode current source of transistors M13 and M14 to ground. With transistor M11 on, node N1 is pulled low, turning off transistor M12 so that all conduction is through transistor M11 to ground under these conditions.

After a time delay $Td_{on}$, the signal E goes high. This turns off transistor M11, with node N1 being pulled high so as to bias transistor M12 on, thereby now steering all of the source current to the output OUT.

Upon a change in the logical input Q cycle, the control signals return to their quiescent state in reverse order. More specifically, signal E first goes low, turning on transistor M11 to pull node N1 low, turning off transistor M12 so as to now steer the current through transistor M11 to ground. Then the signal $\overline{C}$ goes high after a delay $Td_{off}$ to turn off transistor M14, and substantially immediately thereafter the signal C goes low to turn on transistor M13, pulling the gate of transistor M14 high by connection thereof to the supply voltage VDD through transistor M13. The time delays $Td_{on}$ and $Td_{off}$ are not necessarily equal.

Figure 8B:
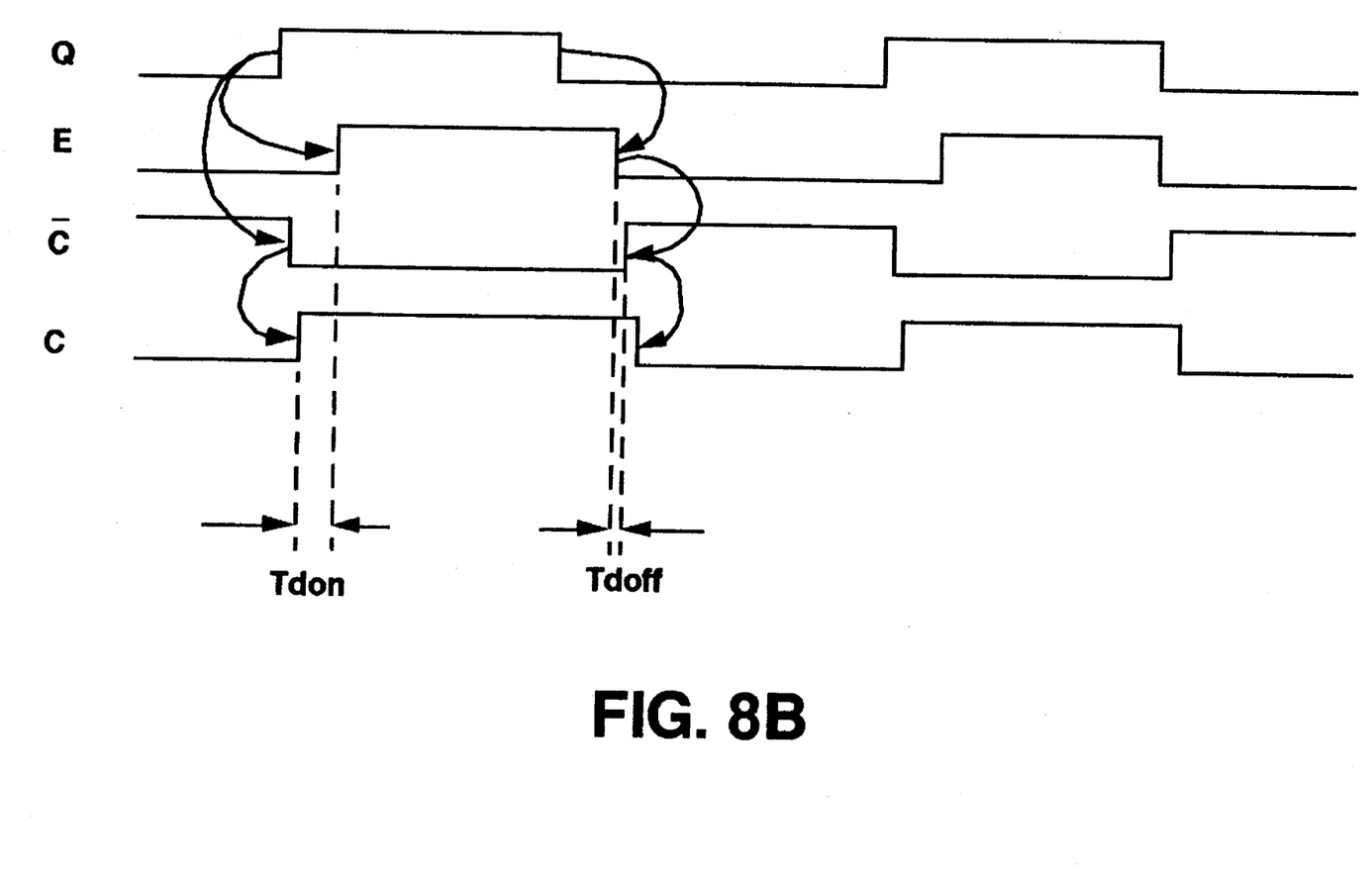
FIG. 8B depicts a timing diagram illustrating the control signal and transition cycles of the dynamic current steering circuit of FIG. 8A.

In general, the signal C and $\overline{C}$ are phased, though these signals preferably follow each other very closely in the sequence shown in FIG. 8B to minimize delays between circuit activation and actual circuit output current. The signal E, on the other hand, is delayed on the rising edge with respect to signal $\overline{C}$ to allow the current directed to ground to stabilize before steering the same to the output.

The control signals for circuit 60 may also be generated using the circuits of FIGS. 2 and 4. However, the control circuit of FIG. 10A offers several additional advantages. In the prior control scheme, the signals E and $\overline{C}$ are used to encode C. This involves a two-step process, instead of the one-step process provided by the circuit of FIG. 10A. As a result, the control circuits of FIGS. 10A and 10B have fewer gates and are simpler to implement. In addition, the circuit of FIG. 10A provides control signals C and $\overline{C}$ which do not overlap.

Figure 9A:
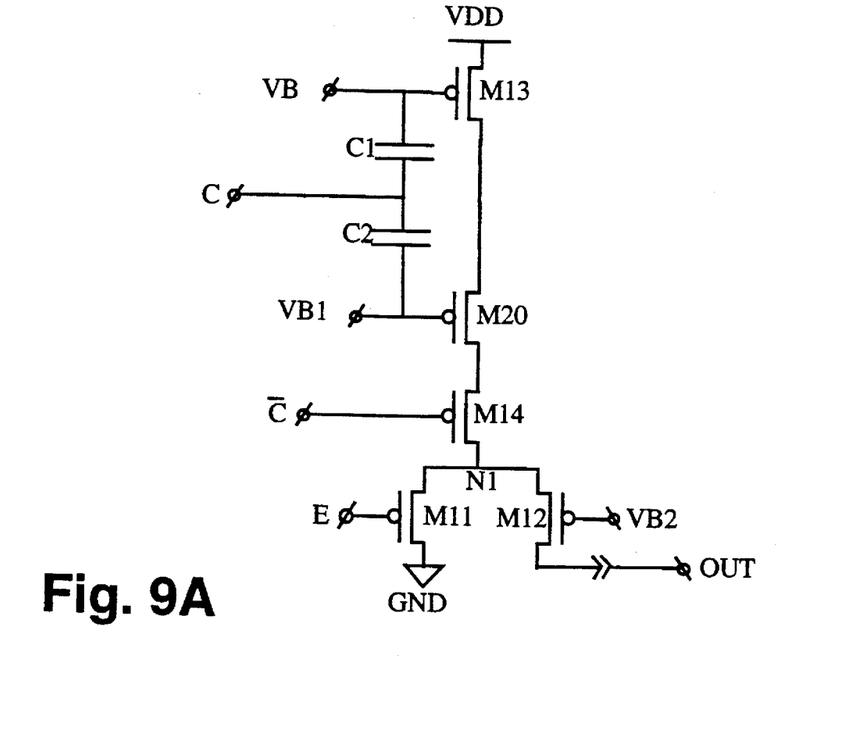
FIG. 9A depicts a schematic diagram of a third embodiment of the dynamic current steering circuit shown in FIG. 6.
Figure 9B:
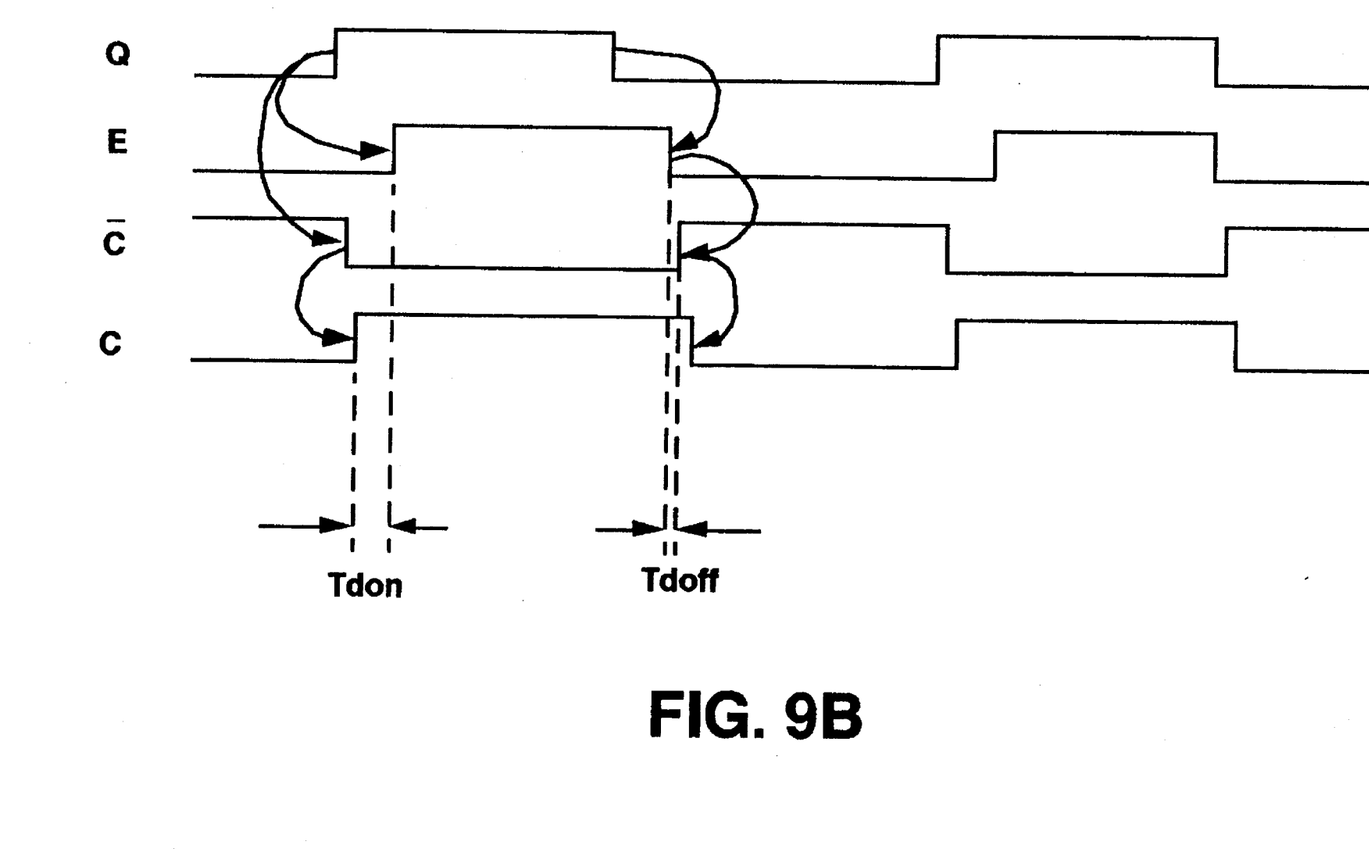
FIG. 9B depicts a timing diagram illustrating the control signal and transition cycles of the dynamic current steering circuit of FIG. 9A.

A third embodiment of the present invention is shown in FIG. 9A. The differences between the circuits in FIGS. 9A and 7A are as follows: in the circuit of FIG. 9A, M20 is introduced between M13 and M14, such that the source of M20 is connected to the drain of M13, while the drain of M20 is connected to the source of M14. The gate of M20 is connected to VB1. This arrangement allows M20 to act as a second current source device and to act in concert with M13 to form a current source cascode, thus improving current matching and current source impedance. In this third embodiment, M14 still acts as a pure switch operating in the triode region. In the circuit, an additional compensation capacitor C2 is also added to the circuit to stabilize the bias node VB1. The capacitor C2 is coupled at one end to the signal C and at the other end to VB1. Like C1, C2 may be a MOS capacitor or any other capacitor as known in the art. FIG. 9B depicts the timing diagram for the control and transition cycles of the dynamic current steering circuit of FIG. 9A. The control signals for the embodiment of FIG. 9A may be provided by the circuit of FIG. 10A or FIG. 10B. As can be observed, the timing and transition cycles for the second and third embodiments, shown respectively in FIGS. 8B and 9B, can be identical.

While the present invention has been disclosed and described with respect to certain preferred embodiments thereof, it will be understood to those skilled in the art that the present invention may be varied without departing from the spirit and scope of the invention. The described embodiments are to be considered in all respects only as illustrative and not restrictive. The scope of the invention is, therefore, indicated by the appended claims rather than the foregoing description. All changes which come within the meaning and range of equivalency of the claims are to be embraced within their scope.

What is claimed is:

1. A high speed current switching circuit coupled and responsive to a digital signal having first and second signal levels, comprising:

first, second, third and fourth p-channel transistors, each having a source, a gate and a drain;

the source of the first transistor being coupled to a first voltage, the drain of the first transistor being coupled to the source of the second transistor;

the drain of the second transistor, the sources of the third and fourth transistors being coupled together;

the drain of the third transistor being coupled to a second voltage which is a lower voltage than the first voltage;

the drain of the fourth transistor being coupled to a current output for the current switching circuit;

the gate of the first transistor being coupled to a first bias voltage so that the gate to source voltage of the first transistor establishes a predetermined current through the first transistor when the second transistor is switched on;

the gate of the fourth transistor being coupled to a third voltage intermediate the first digital signal level and the second digital signal level of the digital signal; and means responsive to the digital signal changing from said first digital signal level to said second digital signal level, for switching on the second transistor to direct the predetermined current through the third transistor, and then switching off the third transistor to steer the predetermined current from the third transistor to the fourth transistor;

said means also for switching the fourth transistor on to provide the predetermined current through the fourth transistor.

2. The high speed current switching circuit of claim 1 wherein the means receiving the digital signal for switching the fourth transistor on to provide the predetermined current through the fourth transistor and for switching the third transistor off responsive to the digital signal changing to the second digital signal level comprises means to switch the second transistor on a predetermined length of time before switching the third transistor off.

3. The high speed current switching circuit of claim 2 further comprising a circuit for switching the fourth transistor off prior to the digital signal changing to the second digital signal level.

4. The high speed current switching circuit of claim 2 further comprising a fifth transistor and a sixth transistor, each having a source, a gate and a drain, the source of the fifth transistor being coupled to the first voltage, the drain of the fifth transistor being coupled to the gate of the second transistor, the source of the sixth transistor being coupled to a second bias voltage and the drain of the sixth transistor being coupled to the gate of the second transistor.

5. A high speed current switching circuit coupled and responsive to a current switching circuit control digital signal having first and second signal levels, comprising:

first, second, third and fourth p-channel transistors, each having a source, a gate and a drain;

the source of the first transistor being coupled to a first voltage, the drain of the first transistor being coupled to the source of the second transistor;

the drain of the second transistor, the sources of the third and fourth transistors being coupled together;

the drain of the third transistor being coupled to a second voltage which is a lower voltage than the first voltage;

the drain of the fourth transistor being coupled to a current output for the current switching circuit;

the gate of the first transistor being coupled to a first bias voltage so that the gate to source voltage of the first transistor establishes the predetermined current through the first transistor when the second transistor is switched on;

the gate of the fourth transistor being coupled to a third voltage intermediate the first digital signal level and the second digital signal level of the digital signal; and said circuit responsive to the digital signal changing from said first digital signal level to said second digital signal level, for switching on the second transistor to direct the predetermined current through the third transistor, and then switching off the third transistor to steer the predetermined current from the third transistor to the fourth transistor;

said circuit for switching the fourth transistor on to provide the predetermined current through the fourth transistor.

6. The high speed current switching circuit of claim 5 wherein the circuit for switching the second transistor on to provide a predetermined current through the fourth transistor and for switching the third transistor off responsive to a current switching circuit control digital signal comprises a circuit to switch the second transistor on a predetermined length of time before switching the third transistor off.

7. The high speed current switching circuit of claim 6 wherein the circuit to switch the second transistor on a predetermined length of time before switching the third transistor off is a circuit for switching on the fourth transistor responsive to the current switching circuit control digital signal, and a delay circuit responsive to the current switching circuit control digital signal to switch the third transistor off the predetermined length of time after the second transistor is switched on.

8. The high speed current switching circuit of claim 6 further comprising a circuit for switching the fourth transistor off prior to the current switching circuit control digital signal.

9. The high speed current switching circuit of claim 6 further comprising a fifth and a sixth transistor, each having a source, a gate and a drain, the source of the fifth transistor being coupled to the first voltage, the drain of the sixth transistor being coupled to the gate of the second transistor, the source of the sixth transistor being coupled to a second reference voltage.

10. A method of providing a high speed current switching circuit coupled and responsive to a digital control signal having first and second states comprising the steps of:

(a) providing:

first, second, third and fourth p-channel transistors, each having a source, a gate and a drain;

the source of the first transistor being coupled to a first voltage, the drain of the first transistor being coupled to the source of the second transistor, the gate of the first transistor being coupled to a first bias voltage;

the drain of the second transistor, the sources of the third and fourth transistors being coupled together;

the drain of the third transistor being coupled to a second voltage which is a lower voltage than the first voltage;

the drain of the fourth transistor being coupled to a current output for the current switching circuit; and the gate of the first transistor being coupled to a first bias voltage so that the gate to source voltage of the first transistor establishes a predetermined current through the first transistor;

the gate of the fourth transistor being coupled to a third voltage intermediate a first digital signal level and a second digital signal level of the digital signal, the drain of the fourth transistor being coupled to a ground terminal;

(b) when the digital control signal is in the first state, switching the fourth transistor off and the third transistor on;

(c) when the digital control signal changes to the second state;
   i) switching on the fourth transistor;
   ii) then switching off the third transistor;

(d) when the digital control signal returns to the first state;
   i) switching on the third transistor;
   ii) then switching off the fourth transistor.

11. The method of claim 10 wherein step (a) further comprises the step of providing a fifth transistor and a sixth transistor, each having a source, a gate and a drain, the source of the fifth transistor being coupled to the first voltge, the drain of the fifth transistor being coupled to the gate of the second transistor, the source of the sixth transistor being coupled to a second bias voltage and the drain of the sixth transistor being coupled to the gate of the second transistor.

12. A high speed current switching circuit coupled and responsive to a digital input signal having first and second digital input signal levels, comprising:

first, second, third and fourth p-channel transistors, each having a source, a gate and a drain;

the source of the first transistor being coupled to a first voltage, the drain of the first transistor being coupled to the source of the second transistor;

the drain of the second transistor, the sources of the third and fourth transistors being coupled together;

the drain of the third transistor being coupled to a second voltage which is a lower voltage than the first voltage the current output for the current switching circuit;

the drain of the fourth transistor being coupled to a current output for the current switching circuit;

the gate of the first transistor being coupled to a first bias voltage so that the gate to source voltage of the first transistor establishes a predetermined current through the first transistor;

the gate of the fourth transistor being coupled to a third voltage selected to cause the fourth transistor to change between on and off for a gate voltage on the second transistor intermediate the first digital input signal level and the second digital input signal level; and means responsive to the digital signal changing from said first digital signal level to said second digital signal level, for providing the gate voltage on the second transistor to direct the predetermined current through the third transistor, and then switching off the third transistor to steer the predetermined current from the third transistor to the fourth transistor, said means also for switching the fourth transistor on to provide the predetermined current through the fourth transistor.

* * * * *